United States Patent [19]
Jahns

[11] 3,973,461
[45] Aug. 10, 1976

[54] DISTORTION CONTROL CIRCUIT

[75] Inventor: Edward R. Jahns, Fullerton, Calif.

[73] Assignee: CBS Inc., New York, N.Y.

[22] Filed: Aug. 15, 1974

[21] Appl. No.: 497,820

[52] U.S. Cl. .............................. 84/1.24; 84/1.21; 84/1.12; 84/1.11; 84/1.19
[51] Int. Cl.² .......................................... G10H 1/02
[58] Field of Search ................. 84/1.01, 1.09, 1.12, 84/1.21, 1.16, 1.19, 1.11, 1.24, 1.14; 328/162, 163; 330/108, 149, 22, 105, 144, 158, 192, 193, 207 A; 179/1 J

[56] References Cited
UNITED STATES PATENTS

| | | | |
|---|---|---|---|
| 2,230,836 | 2/1941 | Hammond | 84/1.24 X |
| 2,523,294 | 9/1950 | Hallmark | 330/108 X |
| 3,389,344 | 6/1968 | Fichtner | 330/149 X |
| 3,418,590 | 12/1968 | Rongen et al. | 330/22 X |
| 3,530,224 | 9/1970 | Plunkett et al. | 84/1.11 |
| 3,553,338 | 1/1971 | Holman | 84/1.14 |
| 3,565,996 | 2/1971 | Suzuki | 84/1.24 X |
| 3,609,205 | 9/1971 | Schwartz | 84/1.25 |
| 3,644,657 | 2/1972 | Miller | 84/1.25 |
| 3,719,782 | 3/1973 | Barnum | 179/1 J |
| 3,825,850 | 7/1974 | Meri | 330/22 |

OTHER PUBLICATIONS

J. D. Ryder, "Electronic Fundamentals and Applications" pp. 223 & 260–265, Prentice–Hall, Inc., Englewood Cliffs, N.J., 1965.

Primary Examiner—Ulysses Weldon
Attorney, Agent, or Firm—Allan Rothenberg; Richard L. Gausewitz

[57] ABSTRACT

A selective distortion control circuit for an electrical musical instrument employs a cathode or emitter follower valve having a load resistance that is selectively changed to provide either a clean or distorted output signal. The mutually in-phase clean input and distorted output of the valve are connected to opposite sides of a potentiometer of which the wiper provides a selectively proportioned mixture of clean and distorted signals. The relative amount of distortion may be selected, and once selected, the operator may readily choose between clean and distorted sound by changing the load resistance.

18 Claims, 4 Drawing Figures

3,973,461

DISTORTION CONTROL CIRCUIT

BACKGROUND OF THE INVENTION

The present invention relates to circuitry for handling electrical musical signals and more particularly concerns electrical musical instrument amplifiers that enable the musician to provide a readily-selected amount of distortion and/or harmonics in the sound of his music.

Different musicians will differ in taste and requirement for harmonic content on the sound created. Some musicians in general prefer a relatively clean or undistorted sound having a relatively low harmonic content and distortion, whereas others typically prefer high levels of both harmonics and distortion. Further, the amount of harmonics and distortion that may be desired will vary with selections being played by a particular musician. Various types of tone-modifying circuits have been employed over the past years in electrical-musical instruments for providing different musical effects such as wah-wah, tremulo, reverberation, fuzz and distortion. Such circuits are exemplified by U.S. Pat. Nos. 3,213,181 to Snoddy et al.; 3,530,224 to Plunkett et al.; 3,544,694 to Freeman; 3,553,338 to Holman; 3,663,735 to Evans; 3,749,809 to Niinomi.

Throughout this application, the terms "distortion" and "harmonics" are used interchangeably, as the effects known as distortion and/or high-level harmonics are substantially identical for the purposes of this invention.

Where distortion is required according to the selection of the musician, a separate distortion circuit or channel has been provided in the past. When the distortion or special effects are required, the output of this channel is switched to the sound transducer or loudspeaker output. However, the prior systems suffer from a significant defect in that the amount of distortion is not readily selectable without significantly changing the apparent average sound level of the output. Accordingly, in instruments of the prior art, it is necessary to operate two controls simultaneously in order to vary the amount of desired distortion or harmonics without changing the apparent loudness of the output. For example, in order to increase the amount of distortion in prior systems, the musician would operate a distortion channel volume control to increase the level of the signal in this channel and thus increase the amount of distortion, and at the same time, would adjust a master volume control to decrease the sound level output.

Further, once having selected the particular amount of distortion, it is often desirable to change the sound output from a distorted version to a clean or undistorted version in the course of a particular musical selection. Circuits of the prior art are not readily adaptable to such controlled switching between distorted and clean sounds and often introduce noise such as audible clicks that are attendant upon switching. The above-mentioned patent to Evans describes an arrangement employing ganged switching devices at the ouput of each of a pair of channels for choosing one or the other, but this arrangement requires relatively complex additional circuitry and simultaneous control of several switches.

Accordingly, it is an object of the present invention to provide a selective distortion circuit for an electrical musical instrument that substantially eliminates or minimizes the above-mentioned problems of the prior art and enables the combining of a signal having a selected amount of distortion or harmonic content with a clean signal in a desired degree.

SUMMARY OF THE INVENTION

In carrying out principles of the present invention in accordance with a preferred embodiment thereof, first and second signal channels, one providing a clean signal and the other a distorted signal, have their output signal magnitudes varied in mutually-opposite sense and combined to provide mixtures of a clean and distorted signal of selectively variable proportions. To switch between distorted and clean sounds, after selecting a desired amount of distortion, provision is made to modify the distortion channel to make it non-distorting so that only clean sound or signals are provided by both channels to be combined. According to another feature of the invention, the distorted and clean signal channels provide signals of like phase so that cancellation effects are minimized. In a specific mechanization of the invention, an electronic valve has its load selectively variable to cause its output to be either distorted or undistorted. The input to the valve is combined with the in-phase valve output in readily adjustable proportions to provide a combination of a selected amount of clean and distorted signals.

DETAILED DESCRIPTION

Figure 1:
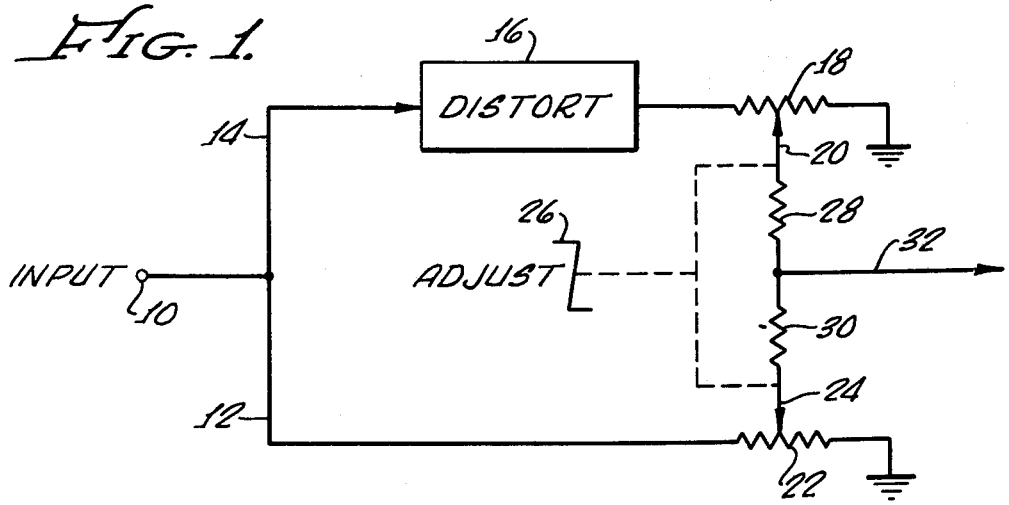
FIG. 1 illustrates a two-channel arrangement for combining distorted and clean signals in an electrical musical instrument amplifier.

As illustrated in FIG. 1, an electrical signal provided by an electrical musical instrument such as, for example, the electrical signal generated by the transducer of an electrical guitar, is fed to an input terminal 10 and thence to a clean signal channel 12 and a distortion channel 14 in parallel with the clean signal channel. The distortion channel 14 includes a distortion circuit 16 having an output fed to a distortion potentiometer 18 with a wiper arm 20. The clean signal has an output potentiometer 22 with a wiper arm 24 which is ganged with wiper arm 20 for simultaneous operation by a manual control 26. The two wiper arms 20, 24 are connected to opposite sides of a pair of interconnected resistors 28, 30 from the junction of which is provided the desired output signal, on line 32. In the arrangement of FIG. 1, circuit 16 adds a predetermined distortion effect to the clean (undistorted) signal provided at input terminal 10, or it will provide a selected high level of harmonics having a desired sound. The magnitude of this distorted or high-harmonic signal is varied by potentiometer 18, 20, according to the desires of the musician for more or less harmonics or distortion.

In order to insure that the signal level output at line 32 remains relatively unchanged as the amount of distortion is increased or decreased, the two potentiometers 18, 20 and 22, 24 are concomitantly varied in mutually opposite sense. Accordingly, as arm 20 of distortion potentiometer 18 is moved to the left in FIG. 1 to thereby decrease the amount of distortion signal in the output, the arm 24 of potentiometer 22 is moved towards the right to concomitantly increase the amount of clean signal whereby the total magnitude of the combined signal components remains relatively unchanged.

Figure 2:
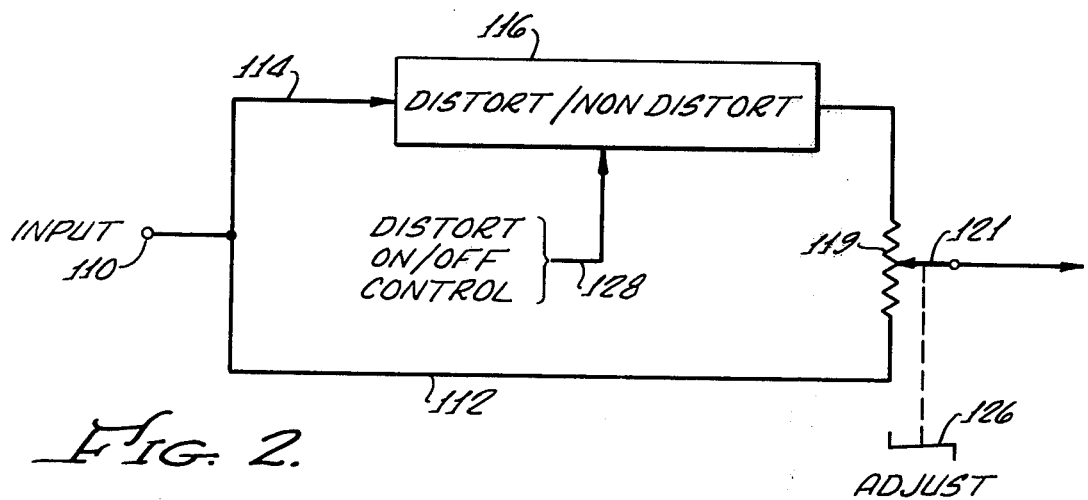
FIG. 2 illustrates a modification of FIG. 1 wherein the distorted and undistorted signals are combined with like phase, and wherein the distortion provided by the distorion channel is selectively disabled.

Illustrated in FIG. 2 is a block diagram of a system which enables selective combining of desired proportions of clean and distorted signals without variation in output volume. and, in addition, allows a simple remote on-off control of the distortion selected. In this arrangement, the signal at an input terminal 110 is fed to a distortion channel 114 having a distortion circuit 116. The clean signal at input 110 is also fed to a clean signal channel 112 having its output connected to the output of the distortion channel 116 via a resistor 119 having a variable tap or wiper arm 121. In this arrangement, the distortion circuit 116 provides an output that is in phase with the input thereto whereby signals in the two channels will not cancel regardless of the position of the wiper arm 121, which is adjustable by a manual control knob 126.

In the arrangement of FIG. 2, distrotion control circuit 116 is operable under control of an on-off signal furnished on a line 128 to provide at its output either a distorted signal or, in the alternative, a signal having relatively little or no distortion. Accordingly, in the arrangement of FIG. 2, when channel 114 is operable to provide a distorted output, the musician merely adjusts control knob 126 to thereby select different types of sound having different amounts of distortion but without significantly varying the effective sound level. Thus, if wiper arm 121 is moved relatively downwardly in the illustration of FIG. 2, a signal having a relatively greater distortion will be provided, whereas if the wiper arm is moved upwardly in FIG. 2, less distortion in the signal is achieved, both with negligible variation in sound or volume. It may be noted that the values of the circuitry are chosen so that the actual audio response is not identical in any control position of wiper arm 121. The values are chosen to provide a loudness effect that remains substantially unchanged to the listener. It is known that the response of the typical human ear over the audio frequency band is a necessary consideration in arriving at the subjective apparent loudness effect.

Figure 3:
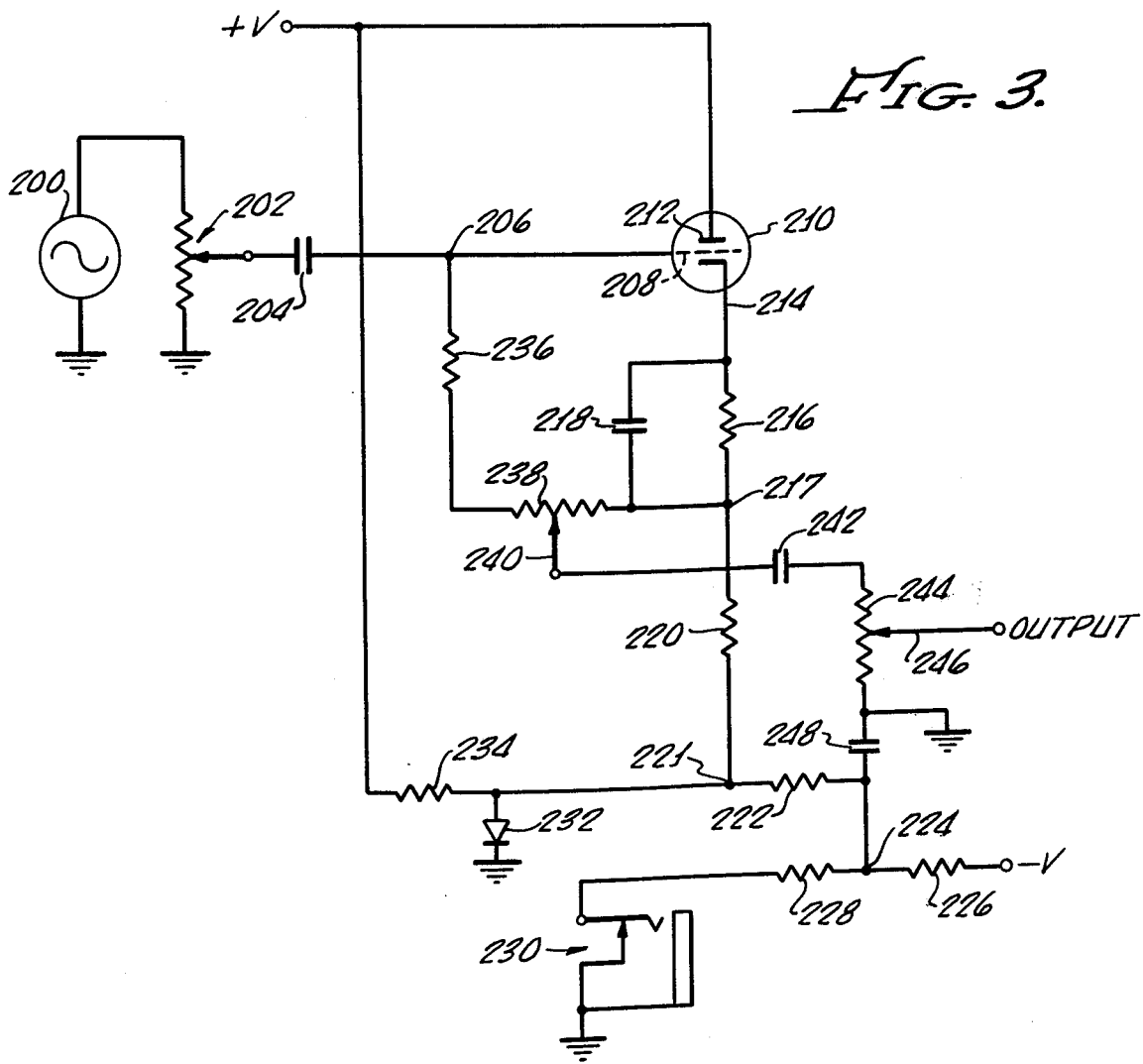
FIG. 3 is a circuit diagram of an electrical musical instrument amplifier or portions thereof illustrating a preferred mechanization of the two-channel arrangement of FIG. 2, employing a vacuum tube.

Illustrated in FIG. 3 is the circuitry of portions of an electrical musical instrument amplifier embodying distortion circuitry of the present invention. In this schematic, a signal generator is depicted as a signal generating source 200 which may include the instrument itself, its output transducer and input stages of the conventional musical instrument amplifier. The signal from source 200 is fed to a first poteniometer 202 that provides a channel loudness control, thence via a capacitor 204 and a junction point 206 to the control grid 208 of a vacuum tube triode 210 having a plate 212 and a cathode 214. The vacuum tube plate is connected directly to a source of a positive potential +V, such as 317 volts, for example. The cathode is connected via a parallel resistance capacitance circuit 216, 218 to a selectively variable cathode load circuit.

The cathode load circuit (which actually includes elements 216, 218) comprises a first load resistor 220 and a second load resistor 222 which are, in effect, selectively applied in the output electrode circuit of the cathode follower as will be more particularly described below. The two resistors 220, 222 are connected in series to a junction point 224 and thence to two different potential levels. The first of these levels is a negative voltage, −V, such as negative 46 volts, for example, connected to junction point 224 via a resistor 226. The second of these potentials is the ground of the system to which junction point 224 is connected via resistor 228 and a remotely operable switch such as the conventional jack 230. Jack 230 will selectively connect resistor 228 to ground or leave one end of this resistor floating.

The junction 221 of the two load resistors 220 and 222 is connected to one side (anode) of a diode 232 which has the same side connected to the positive source of potential via a diode bias resistor 234. The other side of the diode is connected to ground.

The input to the cathode follower valve at point 206 is connected to its output at point 217 (the junction between resistors 216 and 220) via a fixed resistor 236 and a variably tapped resistor or potentiometer 238. A movable wiper arm 240 of resistor 238 is connected via a capacitor 242 to one side of a master volume potentiometer 244 having a wiper arm 246 at which appears a combined signal to be fed to output stages (not shown) of the amplifier. The other side of potentiometer 244 is connected to ground and also, via a capacitor 248, to the junction point 224.

The described circuit introduces little phase shift and has a signal level handling capability which depends upon the cathode load. The circuit has a low output impedance in that its amplification is not significantly affected by the load.

Application of the clean musical signal from source 200 via channel volume control 202 and coupling capacitor 204 to the triode grid provides a triode output signal at terminal 217 that is in phase with the input signal at junction point 206. Assuming that distortion is desired, the remote on-off switch 230 (normally operated by a foot pedal that is not shown in this drawing) is closed, in the position illustrated in the drawing, so that the anode of diode 232 receives a positive voltage supplied via resistor 234. The diode is forward biased and conducts to hold the junction of resistors 220 and 222 slightly above ground. Thus, the cathode load of the triode is effectively the value of resistor 220 (and resistor 216). Resistor 220 may be, for example, in the order of 3300 ohms. In the illustrated circuit, resistor 216 is 4700 ohms. In this circuit, this load is a low resistance and is not sufficient to permit adequate voltage swings of the output junction 217 in response to voltage swings of the input signal, at junction 206. Accordingly, the output at junction 217 is distorted and harmonics are added to the output.

This distorted signal is applied to one side of the variably tapped resistor 238 to the other side of which is fed the clean input signal to the cathode follower, attenuated by the attenuating resistor 236. The signals at the input and the output of the cathode follower are in phase with each other and accordingly, no cancellation will occur at any position of the movable wiper arm 240 of resistor 238. To the contrary, the two signals, the input to the triode and its output are combined to provide a smooth continuously variable balance of clean signal from the junction 206 and distorted signal from junction 217. This signal is fed via the master volume control 244, 246 to the amplifier output stages.

As the wiper arm 240 is moved under selective manual control of the musician to provide more or less distortion, there is relatively neligible variation in sound volume. This is so because the attenuating resistor 236 reduces the clean signal at one side of he potentiometer 238 by an amount selected in accordance with the gain of the cathode follower. The gain of the latter is less than unity, about 0.6 with the lower cathode load of resistor 220 in effect. The gain of the cathode follower in this configuration (with the switch 230 closed) is actually somewhat less than 0.6, but because harmonics are introduced by the now-distorting cathode follower, the apparent sound level to the human ear is slightly increased. Accordingly, with an effective or subjective gain of 0.6, resistor 236 is selected to attenuate the clean sound fed to potentiometer 238 by approximately 40% whereby the magnitudes of the distorted and clean signals fed to mutually opposite sides of the potentiometer resistor 238 are substantially equal. Thus, no change in volume occurs as the wiper arm 240 is moved from one end of the resistor to the other.

Now assume that the switch or jack 230 is opened, opening the jack by insertion of a foot pedal plug and setting the foot pedal switch to an "open" position for low distortion. (The foot pedal switch is set to a "closed" position to provide the relatively low distorting cathode load for the triode.) With the foot pedal (and jack 230) open, the anode of diode switch 232 is connected to a potential below ground whereby the diode is cut off and the cathode load on the triode is increased. With switch 230 open, the negative voltage (−V) source effectively lowers the potential on the diode anode via resistors 222 and 226. Resistor 222, which may be in the order of a 22000 ohms, is considerably larger than resistor 220, which is approximately 3300 ohms. Accordingly, when the diode is non-conducting, the effective cathode load on the triode is many times greater. This larger cathode load achieves several results. It reduces the gain of the tube. It also increases the undistorted signal output capability of the tube. Further, this increased cathode load enables the distortion control potentiometer 238, 240 to provide a nearly identical volume or loudness of substantially undistorted sound output at any setting of the distortion control.

It will be seen that the diode switch 232, in effect, provides a selective shunt across the larger resistor 222 so that the smaller load resistor 220 is connected either directly to ground via the conduction diode switch 232, or, when the diode is non-conducting, is connected in series with the large resistor 222 and the capacitor 248 to ground. The capacitor together with the other resistors connected to control the diode switch provide an effectively noiseless switching of the load impedance coupled in the circuit of the output electrodes of the triode valve.

For high distortion output, the cathode load comprises mainly resistors 216 and 220, connected to ground via the conducting diode 232 whereas for a clean output, the cathode load comprises resistors 216, 220 and 222 connected to ground via capacitor 248.

Accordingly, the musician can selectively add or delete distortion to a single chord to an entire song or to even a single note, merely by depressing the foot pedal switch to operate the on-off distortion switch 230.

For very low levels of input signal from source 200, adequate distortion can still be provided by turning up the channel control 202 and concomitantly turning down the master volume 246.

Even with the larger cathode load including both resistors 220 and 222, it is possible to drive the triode sufficiently hard to provide distortion at its output. Accordingly, one can significantly advance the channel volume control 202 to increase the input signal level to the triode and at the same time retard the master volume control 244, 246 whereby operation of the foot pedal controlled on-off switch 230 will allow the musician to select two different levels of distortion without any noticeable output volume change. With these two volume controls 202 and 244, 246 turned up and down respectively, a higher level of distortion will be provided with switch 230 closed and a lesser amount of distortion will be provided in the normally clean mode of operation, with the switch 230 open.

Although the specific mechanization of the present invention has been described as embodying a vacuum tube valve, it will be readily appreciated that equivalent solid-state electronic valves such as integrated circuit elements, including field effect transistors and the like, may readily be employed in carrying out principles of the present invention. Illustrative of one of such solid-state circuits is the arrangement illustrated in FIG. 4 wherein the signal from a source of musical signal 300 is fed via a channel volume control potentiometer 302 and a coupling capacitor 304 to an input junction 306 connected to the control electrode, the base 308, of an NPN transistor having output electrodes including a collector 312 and an emitter 314. The transistor is connected as an emitter follower having a parallel RC bias circuit 316, 318, coupled with the emitter, and an output junction 317 to which is coupled a selectively variable load impedance of this emitter follower.

The variable load impedance includes a first resistor 320 connected directly to ground via a diode switch 332, when the latter is conducting. When the diode switch 332 is non-conducting, the load impedance includes a second resistor 322, which may be in the order of ten times larger than the resistor 320, and also includes a capacitor 348 connecting the load impedance circuit to ground.

A positive source of voltage +V (which may be +15 volts) is connected to the transistor collector 312 and, via a bias resistor 313, to the transistor base 308. The diode switch anode is connected to +V via a resistor 334 and is also connected via resistor 322 and a resistor 326 to a source −V of negative voltage such as negative 10 volts. A diode control switch or jack 330 is connected via a resistor 328 to the junction of resistors 322 and a grounded capacitor 348 to control the potential of the anode on the diode switch 332.

The input and output of the emitter follower circuit are combined by a fixed attenuating resistor 336 and a variably tapped resistor or potentiometer 338 having a movable tap or wiper arm 340. The two resistors 336 and 338 are connected to each other and to the transistor base and emitter electrodes respectively. The emitter follower output at wiper arm 340 is fed via a coupling capacitor 342 to a master volume control 344 having a wiper arm 346 at which appear the selected signals that are fed to the output stage of the amplifier.

Figure 4:
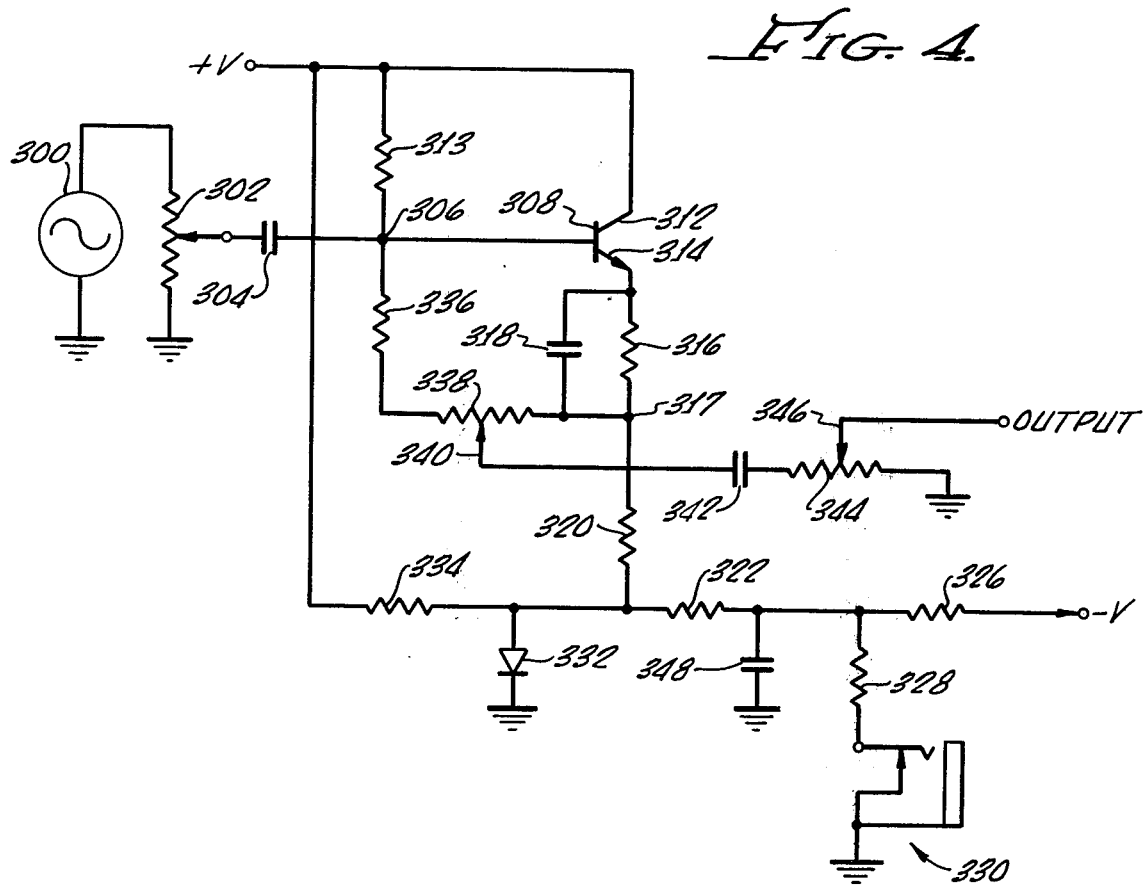
FIG. 4 is a modification of the circuit of FIG. 3 employing a solid-state electronic valve.

The transistor circuit of FIG. 4 operates just as the corresponding vacuum tube circuit of FIG. 3. With the jack 330 closed, in the condition illustrated, either by the insertion of a plug of a remote control foot pedal, with the foot pedal in switch closed position, or by the absence of any plug inserted in the jack, the diode switch 332 is closed, the diode is conducting and the circuit provides a highly distorted output with a high level of harmonics at junction point 317. This distorted version of the input signal is combined in potentiometer 338, 340 with a clean input signal attenuated by resistor 336 to provide an output from the emitter follower circuit having a selected amount of distortion.

Once having selected a desired amount of distortion by manually positioning wiper arm 340, the output signal can be switched between a signal having the selected amount of distortion and a clean signal, nearly entirely free of distortion, simply by opening the diode switch 332, by moving the remote foot pedal switch plugged into jack 330 and, in effect, disconnecting resistor 328 from ground. This provides a reverse bias on the diode 332 and achieves a relatively large increase in magnitude of the load impedance of the emitter follower. The output of the latter will now follow the input with good linearity and a substantially clean and undistorted signal is achieved.

It will be seen that there have been described methods and apparatus for selectively introducing distortion into a musical instrument amplifier without introducing a phase shift, employing a circuit having a good signal level handling capability, low output impedance and an amplification that is primarily a function of the gain of the electronic valve circuit employed. The distortion, once a desired amount has been selected by operation of a single manual control, can be readily inserted into or removed from the circuit by a remote control switch.

The foregoing detailed description is to be clearly understood as given by way of illustration and example only, the spirit and scope of this invention being limited solely by the appended claims.

What is claimed is:

1. A distortion circuit for an electrical musical instrument that produces an electrical musical signal, said circuit comprising:
    an input terminal adapted to receive said electrical musical signal,
    an electronic valve having a control electrode connected to said input terminal, and having first and second output electrodes, said valve having a resistance circuit connected in series with said output electrodes, said resistance circuit including switch means for selectively varying the magnitude of the resistance in series circuit with said output electrodes from a relatively high resistance value to a relatively low resistance value,
    a voltage divider connected between said control electrode and a point in said resistance circuit, and
    an output terminal connected to a selectively variable point on said divider,
    said electronic valve comprising a cathode follower having a grid electrode, plate electrode and cathode electrode corresponding respectively to said control electrode, and said first and second output electrodes, said switch means comprising a diode having one side connected to ground, said resistance circuit including first and second resistors connected in series between the other side of said diode and said cathode electrode, said plate electrode being connected to a source of positive potential, a third resistor connected between the other side of said diode and a source of negative potential, said third resistor being considerably larger than both of said first and second resistors, and manually operated switch means for controlling conduction of said diode.

2. The distortion circuit of claim 1 wherein said voltage divider includes a variable resistor having one side connected to the junction between said first and second resistors and having a variable wiper arm providing an output terminal, and a further resistor connected between said grid electrode and the other side of said variable resistor.

3. A distortion circuit for an electrical musical instrument that produces an electrical musical signal, said circuit comprising:
    an input terminal adapted to receive said electrical musical signal,
    an electronic valve having a control electrode connected to said input terminal, and having first and second output electrodes, said valve having a resistance circuit connected in series with said resistance circuit connected in series with said output electrodes, said resistance circuit including switch means for selectively varying the magnitude of the resistance in series circuit with said output electrodes from a relatively high resistance value to a relatively low resistance value,
    a voltage divider connected between said control electrode and a point in said resistance circuit, and an output terminal connected to a selectively variable point on said divider, said electronic valve comprising a semi-conductor device having a base electrode, a collector electrode and an emitter electrode
    corresponding respectively to said control electrode, and said first and second output electrodes, said collector electrode being connected to a source of first potential, said resistance circuit comprising first and second series connected resistors connected at one side to said emitter electrode, a third resistor having one side connected to a potential lower than said first potential, said switch means including means for selectively connecting the other side of said first and second series connected resistors alternatively to the other side of said third resistor or to a potential lower than said first potential, whereby an output signal appearing at the junction of said first and second resistors will substantially linearly follow the input signal applied to said base electrode when said third resistor is connected to said first and second resistors, and whereby an output signal at the junction of said first and second resistors will provide a distorted version of the input signal applied to said base electrode when said first and second resistors are connected by said switch to said point of lower potential.

4. The distortion circuit of claim 3 wherein said voltage divider includes a fourth resistor and a variable resistor series connected between said base electrode and the junction of said first and second resistors, said variable resistor having a selectively variable wiper arm providing an output terminal for said circuit wherein said output terminal will provide an output signal comprising a combination of a first signal component derived from the signal appearing at said base electrode and a second signal component derived from the signal appearing in the emitter circuit of said semi-conductor device at the junction of said first and second resistors, and wherein the relative magnitudes of said first and second components are simultaneously varied in mutually opposite sense by selective operation of the wiper arm of said variable resistor.

5. A distortion circuit for an electrical musical instrument that produces an electrical musical signal, said circuit comprising:
an input terminal adapted to receive said electrical musical signal,
an electronic valve having a control electrode connected to said input terminal, and having first and second output electrodes, said valve having a resistance circuit connected in series with said output electrodes, said resistance circuit including switch means for selectively varying the magnitude of the resistance in series circuit with said output electrodes from a relatively high resistance value to a relatively low resistance value,
a voltage divider connected between said control electrode and a point in said resistance circuit, and
an output terminal connected to a selectively variable point on said divider.

6. The distortion circuit of claim 5 wherein said means for selectively controlling the resistance of said resistance circuit comprises a diode switch, and means for selectively operating said diode switch.

7. A distortion control circuit for an electrical musical instrument that produces an electrical musical signal, said circuit comprising:
a distortion circuit responsive to said electrical musical signal for providing a first signal component, said distortion circuit comprising an electronic valve having first and second output electrodes and having a control electrode, said electrical musical signal being connected to said control electrode,
means responsive to the electrical musical signal for providing a second signal component,
control means for combining said first and second signal components and simultaneously effecting opposite sense adjustment of the relative magnitudes thereof,
said output electrodes having a relatively low resistance in circuit therewith whereby said first signal component will nonlinearly follow variations in a signal applied to said control electrode, and
a second control means independent of said first mentioned control means for selectively disabling the distortion of said distortion circuit to provide said first signal component as a substantially undistorted version of said electrical musical signal, said second control means comprising means for changing the value of said resistance in circuit with said output electrodes.

8. The distortion control circuit of claim 7 wherein said first-mentioned control means comprises a voltage divider connected between said control electrode and one of said output electrodes, and a selectively variable tap for providing a combined signal from a selectively variable point on said voltage divider.

9. A distortion control circuit for an electrical musical instrument that produces an electrical musical signal, said circuit comprising:
a distortion circuit responsive to said electrical musical signal for providing a first signal component,
means responsive to said electrical musical signal for providing a second signal component,
control means for combining said first and second signal components and simultaneously effecting opposite sense adjustment of the relative magnitudes thereof,
second control means independent of said first-mentioned control means for selectively disabling said distortion circuit to provide said first signal component as a substantially undistorted version of said electrical musical signal,
said distortion circuit comprising an electronic valve having first and second output electrodes and having a control electrode, said electrical musical signal being connected to said control electrode, said output electrodes having a relatively low resistance in circuit therewith whereby said first signal component will nonlinearly follow variations in a signal applied to said control electrode,
said second control means for disabling said distortion circuit comprising a relatively large resistor and means for selectively inserting said relatively large resistor in circuit with said output electrodes of said electronic valve.

10. A circuit for an electrical musical instrument for selectively providing a distroted or substantially undistorted output comprising:
an electronic valve having a control electrode and first and second output electrodes, and selectively variable load impedance means connected in circuit with said output electrodes for selectively varying linearity of an output signal appearing at one of said output electrodes in response to an input signal at said control electrode, said load impedance means comprising means for selectively varying the magnitude of said load impedance,
said means for selectingly varying comprising a semiconductor device having one side connected to a point of a first potential, a first resistor connected between the other side of said device and one of said output electrodes, a second resistor connected between a point of a second potential and said other side of said device, and means for selectively controlling conduction of said device whereby said one output electrode is connected through said first resistor to said point of first potential when the device is in one state of conduction and is connected through both said first and second resistors to said point of second potential when said device is in another state of conduction.

11. The circuit of claim 10 including a variable resistor connected between said one output electrode and said control electrode, and a selectively movable arm in contact with said variable resistor for providing a combined signal including a first component linearly related to said input signal and a second component that is either linearly or non-linearly related to said input signal according to the state of conduction of said semiconductor device.

12. A circuit for controllably distorting a sound signal of an electronic musical instrument comprising:
a first channel including distortion means responsive to said sound signal for transmitting a distorted signal, a second channed for transmitting said sound signal substantially without distortion,
means for combining and for effecting mutually opposite sense variation of the magnitude of signals transmitted respectively by said first and second channels to provide an output signal having selected amounts of distorted and undistorted signals, means for causing said signals transmitted by said channels to have like phases, and means for selectively disabling said distortion means to cause said first channel to transmit said sound signal substantially without distortion.

13. The circuit of claim 12 wherein said distortion means comprises an electronic valve having output and control electrodes and a bias circuit connected with said valve for causing said valve to provide at its output electrode a distorted version of a signal at its control electrode, and said means for selectively disabling including means for selectively modifying said bias circuit to cause said valve to provide at its output electrode a substantially undistorted version of a signal at its control electrode.

14. The circuit of claim 13 wherein said bias circuit includes a power supply and a bias resistor connected between said output electrode and one side of said power supply and wherein said means for selectively modifying said bias circuit comprises a second bias resistor and switch means connected with both said bias resistors for selectively changing the resistance connected in said bias circuit.

15. A controlled distortion circuit for an electrical musical instrument comprising an electronic
    valve having a control electrode for receiving an input signal and an output electrode having loading means for providing a signal in phase with the signal received at said control electrode,
    means for combining said input signal with said output electrode signal in selected proportions,
    and means for switching the said loading means between two discrete values to cause the signal at said output electrode to be distorted or undistorted.

16. The circuit of claim 15 wherein said means for combining comprises an impedance connected between said electrodes and a movable tap on said impedance.

17. The circuit of claim 16 wherein said valve has a gain not greater than unity and including an attenuating impedance connected between said control electrode and said first-mentioned impedance.

18. The circuit of claim 16 including a master volume control responsive to said movable tap.

* * * * *